US00RE46005E

(19) United States
(12) Reissued Patent
Mikhalev et al.

(10) Patent Number: US RE46,005 E
(45) Date of Reissued Patent: May 17, 2016

(54) METHOD AND APPARATUS FOR ENABLING A TIMING SYNCHRONIZATION CIRCUIT

(75) Inventors: Vladimir Mikhalev, Boise, ID (US); Feng Lin, Boise, ID (US)

(73) Assignee: Micron Technology, Inc., Boise, ID (US)

(21) Appl. No.: 11/800,520

(22) Filed: May 4, 2007

Related U.S. Patent Documents

Reissue of:
(64) Patent No.: 6,891,415
Issued: May 10, 2005
Appl. No.: 10/167,195
Filed: Jun. 11, 2002

(51) Int. Cl.
*H03L 7/06* (2006.01)
*H03L 7/081* (2006.01)
*G06F 1/10* (2006.01)
*G11C 7/22* (2006.01)

(52) U.S. Cl.
CPC ..... *H03L 7/0814* (2013.01); *G06F 1/10* (2013.01); *G11C 7/22* (2013.01); *G11C 7/222* (2013.01); *H03L 7/0812* (2013.01)

(58) Field of Classification Search
CPC .... H03L 7/0814; H03L 7/0812; G11C 7/222; G11C 7/22; G06F 1/10
USPC ..... 327/158, 161
See application file for complete search history.

(56) References Cited

U.S. PATENT DOCUMENTS 5,068,628 A 11/1991 Ghoshal ..... 331/1 A
5,386,159 A 1/1995 Dupre ..... 327/310
5,771,264 A * 6/1998 Lane ..... 375/376
5,935,257 A 8/1999 Nishimura ..... 713/503
6,337,590 B1 * 1/2002 Millar ..... 327/158
6,448,756 B1 * 9/2002 Loughmiller ..... 324/76.54
6,539,072 B1 * 3/2003 Donnelly et al. ..... 375/371
6,549,041 B2 * 4/2003 Waldrop ..... 327/5

(Continued)

OTHER PUBLICATIONS

Gomm, Tyler, "Design of a Delay-Locked Loop With a DAC-Controlled Analaog Delay Line", Mar. 2001.*

(Continued)

*Primary Examiner* — Rachna Desai
(74) *Attorney, Agent, or Firm* — Dorsey & Whitney LLP

(57) ABSTRACT

A timing control circuit includes a synchronization circuit and a detection circuit. The synchronization circuit includes a main delay line configured to receive an input clock signal and delay the input clock signal by a time interval to generate an output clock signal and a control circuit configured to control the main delay line to vary the time interval to synchronize the input clock signal with a feedback clock signal generated from the output clock signal responsive to assertion of an enable signal. The detection circuit is configured to receive the input clock signal and the feedback clock signal, detect a phase alignment error between the input clock signal and the feedback clock signal, and assert the enable signal responsive to the phase alignment error exceeding a predetermined amount. A method for synchronizing clock signals includes receiving an input clock signal; delaying the input *clock* signal by a time interval to generate an output clock signal; controlling the time interval to synchronize the input clock signal with a feedback clock signal generated from the output clock signal responsive to assertion of an enable signal; detecting a phase alignment error between the input clock signal and the feedback clock signal; and asserting the enable signal responsive to the phase alignment error exceeding a predetermined amount.

62 Claims, 5 Drawing Sheets

(56) References Cited

U.S. PATENT DOCUMENTS

| | | | | |
|---|---|---|---|---|
| 6,556,643 | B2 * | 4/2003 | Merritt | 377/16 |
| 6,593,786 | B2 * | 7/2003 | Jung | 327/158 |
| 6,605,969 | B2 * | 8/2003 | Mikhalev et al. | 327/158 |
| 6,621,315 | B2 * | 9/2003 | Heo et al. | 327/158 |
| 6,774,687 | B2 * | 8/2004 | Gomm et al. | 327/158 |
| 6,779,126 | B1 * | 8/2004 | Lin et al. | 713/500 |
| 7,035,366 | B2 * | 4/2006 | Tokutome et al. | 375/371 |
| 2001/0044888 | A1 * | 11/2001 | Li et al. | 711/167 |
| 2002/0000851 | A1 | 1/2002 | Miyazaki et al. | |
| 2002/0140471 | A1 * | 10/2002 | Fiscus | 327/158 |
| 2004/0232962 | A1 * | 11/2004 | Gomm et al. | 327/158 |
| 2005/0001662 | A1 * | 1/2005 | Kizer et al. | 327/156 |
| 2005/0206419 | A1 * | 9/2005 | Kizer et al. | 327/158 |
| 2011/0156776 | A1 * | 6/2011 | Kizer | 327/156 |

OTHER PUBLICATIONS

Miyazaki et al.; *Timing-Control Circuit Device and Clock distribution System*, U.S. Pat. Appl. Publication No. US2002/0000851 A1, Publication Date: Jan. 3, 2002, 39 pages.

* cited by examiner

METHOD AND APPARATUS FOR ENABLING A TIMING SYNCHRONIZATION CIRCUIT

Matter enclosed in heavy brackets [ ] appears in the original patent but forms no part of this reissue specification; matter printed in italics indicates the additions made by reissue; a claim printed with strikethrough indicates that the claim was canceled, disclaimed, or held invalid by a prior post-patent action or proceeding.

BACKGROUND OF THE INVENTION

1. Field of the Invention

This invention relates generally to the field of semiconductor device manufacturing and, more particularly, to a method and apparatus for enabling a timing synchronization circuit.

2. Description of the Related Art

Many high speed electronic systems possess critical timing requirements that dictate a need to generate a periodic clock waveform possessing a precise timing relationship with respect to some reference signal. The improved performance of computing integrated circuits and the growing trend to include several computing devices on the same board present a challenge with respect to synchronizing the time frames of all the components.

While the operation of all components in the system should be highly synchronized, i.e., the maximum skew in time between significant edges of the internally generated clocks of all the components should be minimized, it is not enough to feed the reference clock of the system to all the components. This is because different chips may have different manufacturing parameters, which, when taken together with additional factors such as ambient temperature, voltage, and processing variations, may lead to large differences in the phases of the respective chip generated clocks.

Conventionally, synchronization is achieved by using a timing circuit, such as a digital delay locked loop (DDLL) circuit, a clock synchronized delay (CSD) circuit, or a synchronous mirror delay (SMD) circuit to detect the phase difference between clock signals of the same frequency and produce a digital signal related to the phase difference. A common response in a synchronization circuit to high frequency noise is to generate a shift in one direction (i.e., to increase or decrease the delay), followed by a subsequent shift in the opposite direction (i.e., because the first shift was not representative of an actual phase difference between the input and output clocks). This undesirable shifting results in jitter in the output clock signal. This jitter in the output signal may reduce the stability of, or cause an error in, the digital device relying on the output clock.

DDLL circuits typically require a relatively large number of clock cycles to synchronize. As a result of this significant lock period, DDLL circuits are not typically disabled after a lock is achieved to conserve power. DDLL circuits are also not well suited to handling large temperature or voltage shifts due to their slow response time.

CSD and SMD circuits have been developed for providing a fast lock capability (e.g., within 1-4 clock cycles after initialization). One drawback of such circuits is noise sensitivity, which may result in considerable jitter due to process, voltage, and temperature (PVT) variations.

The present invention is directed to overcoming, or at least reducing the effects of, one or more of the problems set forth above.

SUMMARY OF THE INVENTION

One aspect of the present invention is seen in a timing control circuit including a synchronization circuit and a detection circuit. The synchronization circuit includes a main delay line configured to receive an input clock signal and delay the input clock signal by a time interval to generate an output clock signal and a control circuit configured to control the main delay line to vary the time interval to synchronize the input clock signal with the output clock signal responsive to assertion of an enable signal. The detection circuit is configured to receive the input clock signal and a feedback clock signal, detect a phase alignment error between the input clock signal and the feedback clock signal, and assert the enable signal responsive to the phase alignment error exceeding a predetermined amount.

Another aspect of the present invention is seen in a method for synchronizing clock signals. The method includes receiving an input clock signal; delaying the input *clock* signal by a time interval to generate an output clock signal; controlling the time interval to synchronize the input clock signal with a feedback clock signal generated from the output clock signal responsive to assertion of an enable signal; detecting a phase alignment error between the input clock signal and the feedback clock signal; and asserting the enable signal responsive to the phase alignment error exceeding a predetermined amount.

BRIEF DESCRIPTION OF THE DRAWINGS

The invention may be understood by reference to the following description taken in conjunction with the accompanying drawings, in which like reference numerals identify like elements, and in which.

Figure 1:
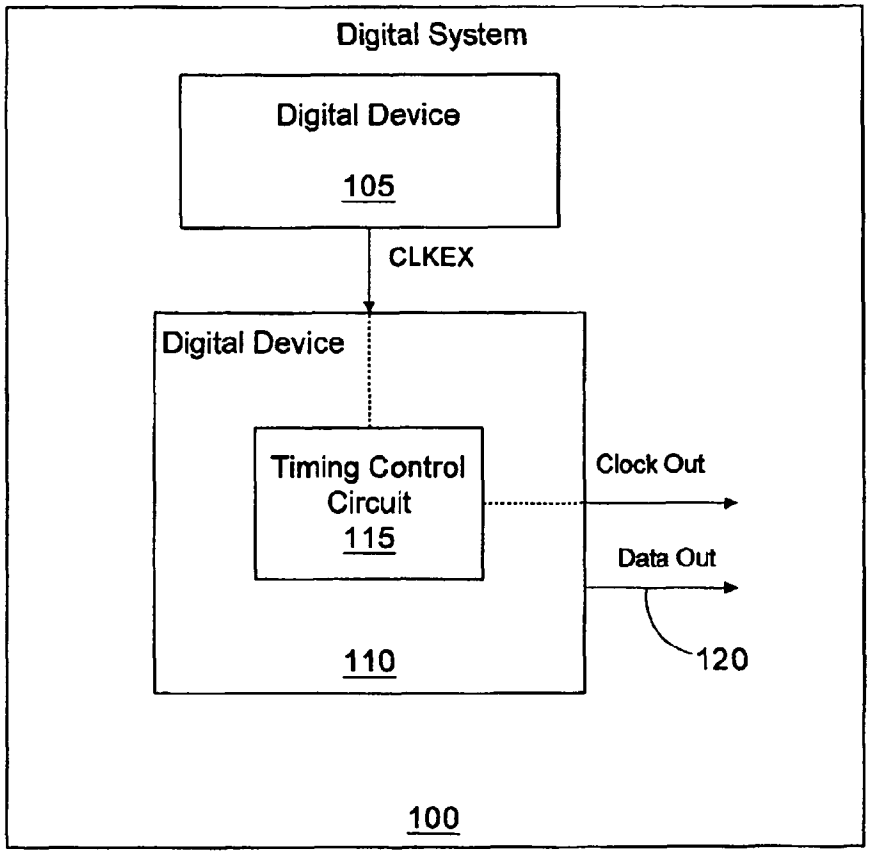
FIG. 1 is a simplified block diagram of a digital system having a timing control circuit in accordance with the present invention.

While the invention is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION OF SPECIFIC EMBODIMENTS

Illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

Referring to FIG. 1, a simplified block diagram of a digital system 100 is provided. The digital system 100 includes a first digital device 105 coupled to a second digital device 110. The first digital device 105 provides a reference clock signal (CLKEX) to the second digital device 110. The second digital device 110 uses the CLKEX signal to synchronize its internal clocks using a timing control circuit 115 and generate an output clock signal (Clock Out). As an illustrative example, the second digital device 110 may be a memory device that synchronizes its output data on a data line 120 with the Clock Out signal.

Figure 2:
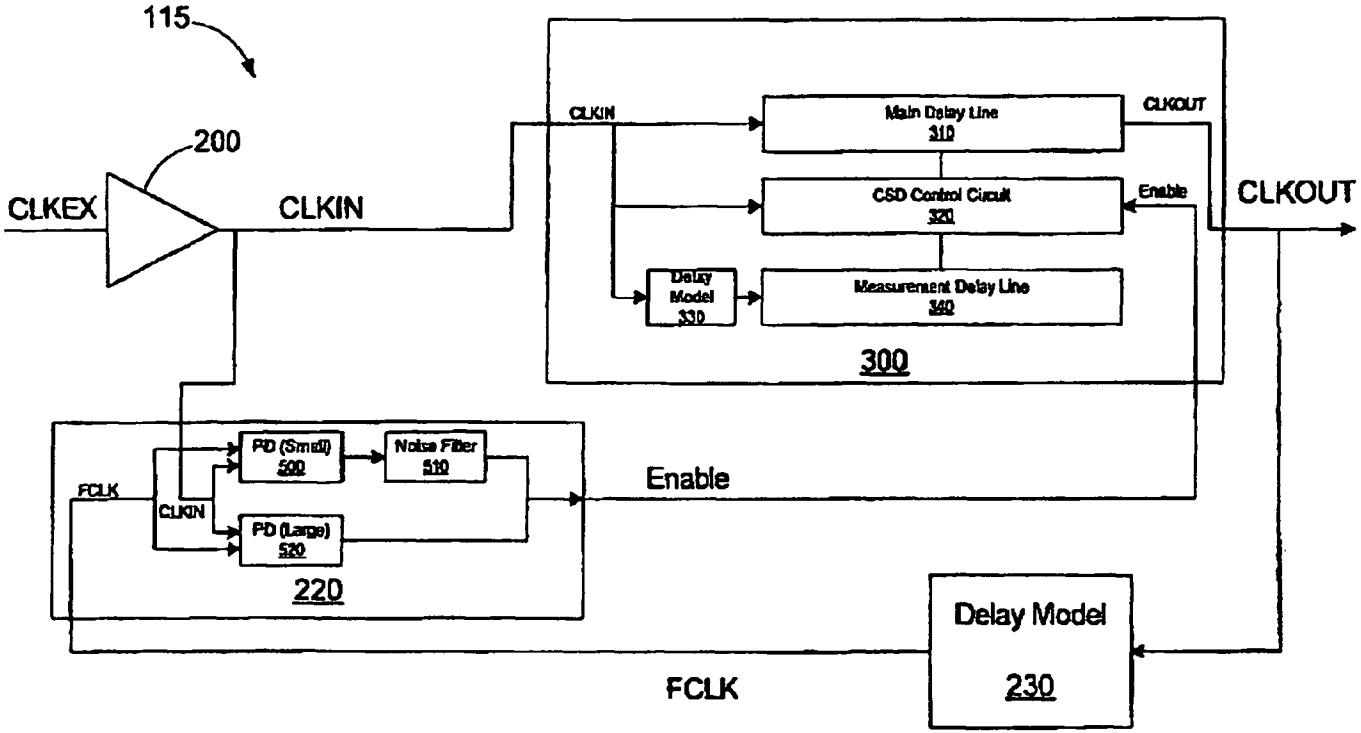
FIG. 2 is simplified block diagram of the timing control circuit of FIG. 1.

Turning now to FIG. 2, a simplified block diagram of the timing control circuit 115 is illustrated. The timing control circuit 115 includes a buffer 200 in which the input clock signal (CLKEX) is received (and produces an output signal CLKIN). The CLKIN signal is passed to a synchronization circuit 210. As described in greater detail below in reference to FIGS. 3 and 4, the synchronization circuit 210 delays the CLKIN signal to generate a CLKOUT feedback signal that is synchronized with the CLKIN signal. The CLKOUT signal is used to control the internal circuitry of the digital device 110 (see FIG. 1) such that the data output by the digital device 110 is synchronized with the CLKEX signal.

After the synchronization circuit 210 performs its synchronization function, its control circuitry may be disabled to conserve power and reduce susceptibility to noise in the CLKIN signal. A detection circuit 220 is provided for monitoring the degree of synchronization between the CLKIN and CLKOUT signals over time to determine whether the control circuitry of the synchronization circuit 210 should be re-enabled to resynchronize the signals, as described in greater detail below in reference to FIG. 5. The detection circuit 220 receives the CLKIN signal and a feedback clock signal (FCLK) corresponding to the actual output clock signal of the device 110 after the clock signal passes through its internal circuitry. The FCLK signal is used as a feedback signal for identifying phase differences between the CLKEX signal and the actual output clock signal of the digital device 110.

To generate the FCLK signal, the CLKOUT signal is passed through a delay model 230 that uses a variety of logic components to approximate the delay introduced in the Clock Out signal by the circuitry of the digital device 110 and the delay in the buffer circuit 200. In an alternative embodiment, the actual output clock signal may be used to generate feedback information for the detection circuit 220 (i.e., with the additional input buffer 200 delay).

Figure 3:
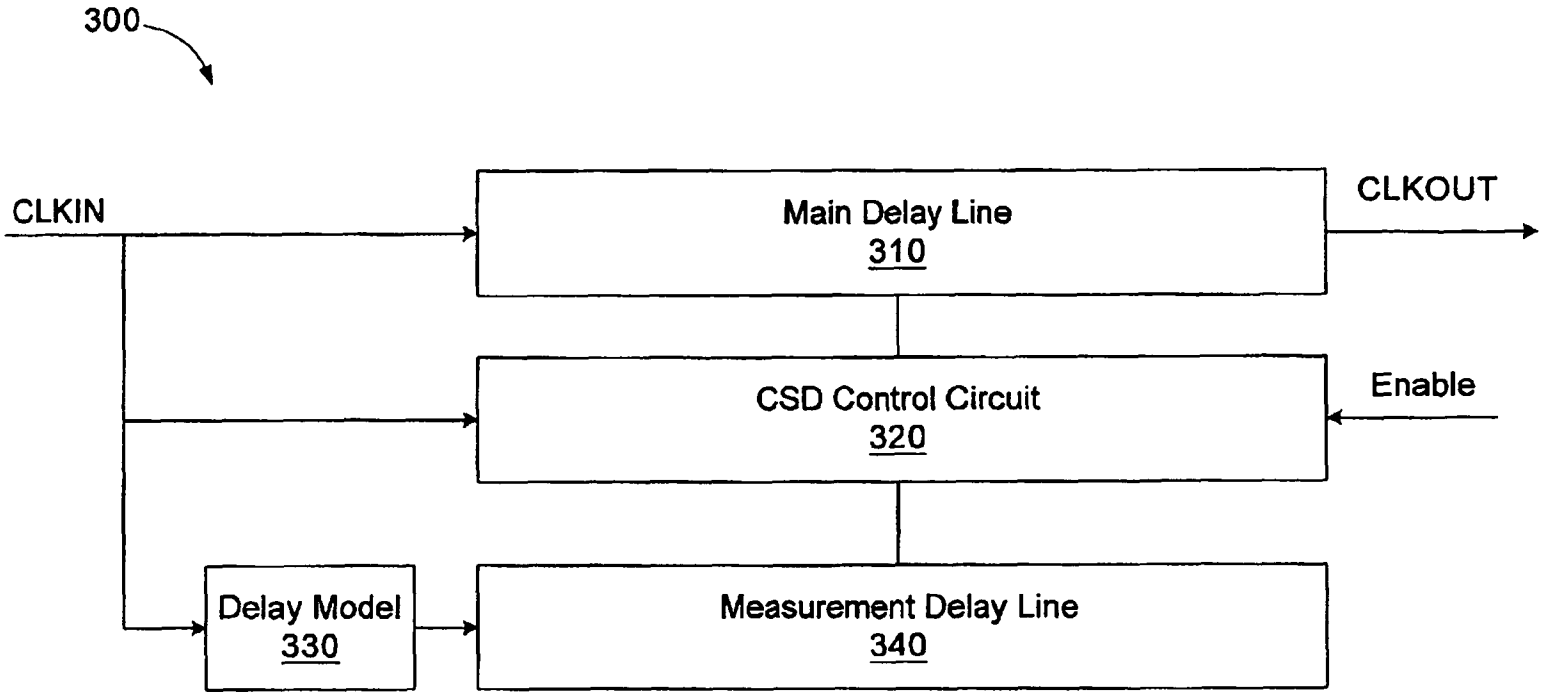
FIG. 3 is a simplified block diagram of a clock synchronized delay (CSD) circuit suitable for use as a synchronization circuit in the timing control circuit of FIG. 2.
Figure 4:
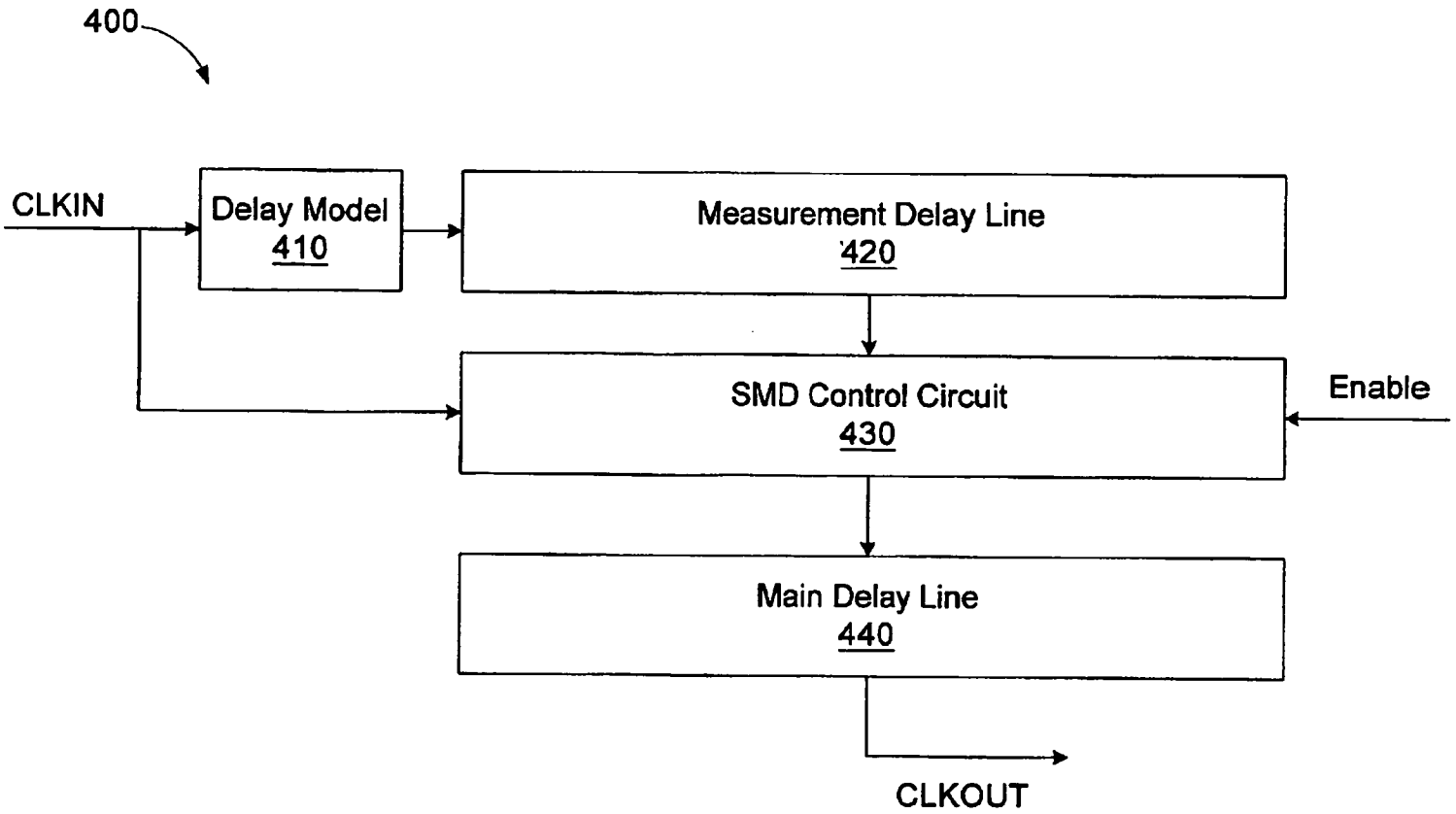
FIG. 4 is a simplified block diagram of a synchronous mirror delay (SMD) circuit suitable for use as a synchronization circuit in the timing control circuit of FIG. 2.

Turning now to FIGS. 3 and 4, simplified block diagrams of CSD and SMD circuits suitable for use as the synchronization circuit 210 are provided, respectively. The construct and operation of CSD and SMD circuits are well known to those of ordinary skill in the art. The invention is not limited to one of these particular embodiments, as other synchronization circuit designs may be used without departing from the spirit and scope of the instant invention.

FIG. 3 illustrates a CSD circuit 300 suitable for use as the synchronization circuit 210. The CLKIN signal from the buffer 200 is passed to a main delay line 310 and a CSD control circuit 320 for controlling the amount of delay imparted by the main delay like 310. The CLKIN signal is also passed to a delay model 330 similar to that of FIG. 2. In one embodiment, the delay models 230, 330 may be implemented in separate circuitry, while in another embodiment, the delay models 230, 330 may be implemented using the same circuitry and multiplexed into the appropriate circuit path as necessary. For example, when the control circuitry of the synchronization circuit 210 is enabled, the delay model 230, 330 may be used in the circuit of FIGS. 3 and 4, and when the control circuitry of the synchronization circuit 210 is disabled, the delay models 230, 330 may be used with the detection circuit 220, as shown in FIG. 2.

The delay model 330 is coupled to a measurement delay line 340. The measurement delay line 340 includes a plurality of delay elements (e.g., individual delay stages with a control gate or a shift register and a plurality of control gates coupled to stages of the shift register). Each delay element has an output that is connected to the CSD control circuit 320. In one embodiment, the CSD control circuit 320 may be a latch array having a plurality of parallel latches. When the delayed signal from the measurement delay line 340 has aligned with the CLKIN signal, the appropriate latch in the CSD control circuit 320 is triggered.

Each output terminal of the plurality of latches in the CSD control circuit 320 is connected to the main delay line 310. The main delay line 310 includes a plurality of serially cascaded delay elements. The CLKIN signal passes through each of the serially cascaded delay elements until it reaches the selected delay element that is gated by the latch of the CSD control circuit 320. The output of the main delay line 310 is the CLKOUT signal that is passed to the internal circuitry of the digital device 110.

Turning now to FIG. 4, an SMD circuit 400 suitable for implementing the synchronization circuit 210 is now described. The CLKIN signal is passed to a delay model 410 similar [an construct] *in construction* and operation to the delay modal 330 of FIG. 3. The output of the delay model 410 is passed to a measurement delay line 420. The measurement delay line 420 includes a plurality of serially cascaded delay elements, such as a shift register and a plurality of control gates coupled to stages of the shift register. As with the measurement delay line 340 of FIG. 3, each element of the measurement delay line 420 is a delay stage with a control gate. The SMD circuit 400 includes an SMD control circuit 430 configured to receive the output signals from each stage of the measurement delay line 420. In the illustrated embodiment, the SMD control circuit 430 is a transfer gate array including a plurality of transfer gates. In other embodiments, other selection logic may be used in lieu of transfer gates. The CLKIN signal is connected to each of the transfer gates. When the delayed signal in the measurement delay line 420 has been delayed by an amount that will align the first cycle of the delayed CLKIN signal with a second cycle of CLKIN signal (i.e., non-delayed), one of the transfer gates in the SMD control circuit 430 is activated. The delayed CLKIN signal is transferred through the selected transfer gate to the main delay line 440.

The main delay line 440 includes plurality of serially connected delay elements each of which has an input terminal connected to the output terminals of the transfer gate array in the SMD control circuit 430. The one transfer gate that is activated when the first pulse of the delayed CLKIN signal is aligned with the CLKIN signal is connected to the main delay line 440. The transferred delayed CLKIN signal is transferred and delayed through the main delay line 440 to generate the CLKOUT signal that is passed to the internal circuitry of the digital device 110.

Figure 5:
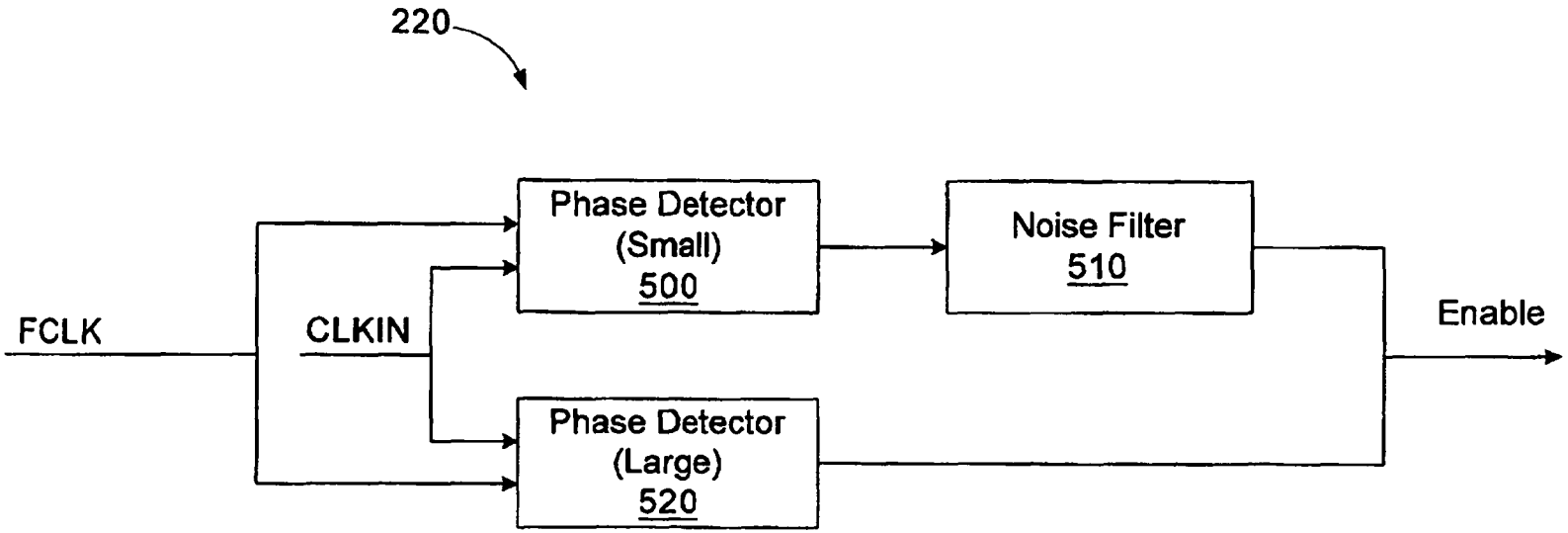
FIG. 5 is a simplified block diagram of a detection circuit suitable for use in the timing control circuit of FIG. 2.

Turning now to FIG. 5, the [construct] *construction* and operation of an exemplary embodiment of the detection circuit 220 is provided. The detection circuit 220 generates an enable signal for enabling the control circuitry (e.g., the CSD control circuit 320 of FIG. 3 or the SMD control circuit 430 of FIG. 4). Electrical power is not actually removed from the control circuits 320, 430, but rather the state of the control circuits 320, 430 is locked, such that the selected latch (i.e., in the CSD control circuit 320) or the selected transfer gate (i.e., in the SMD control circuit 430) cannot change. This locking essentially fixes the amount of delay imparted by the main delay line 310, 440. When the detection circuit 220 identifies conditions under which the CLKIN and CLKOUT signals should be resynchronized, it sends an enable signal to the control circuit 320, 430 to allow a change in state (e.g., in the respective latch or transfer gate).

In the illustrated embodiment, the detection circuit 220 includes a small difference phase detector 500 for detecting changes in the phase between the CLKIN signal and the FCLK signal (i.e., simulated output clock signal). The small difference phase detector 500 is configured to provide a binary signal in response to the phase difference exceeding a predetermined threshold (i.e., in either direction). The output of the small difference phase detector 500 is received by a noise filter 510 configured to reduce the sensitivity of the output of the small difference phase detector 500 to noise. The particular [construct] *construction* of the noise filter 510 depends on the particular implementation and the type of noise expected.

In one embodiment, the noise filter 510 may be a majority filter for reducing jitter in the output of the small difference phase detector 500. For example, high frequency noise in the CLKIN signal may cause an apparent phase shift between the CLKIN and FCLK signals. The transient nature of the noise may result in the small difference phase detector 500 detecting a shift in one direction during one clock cycle followed by a shift in the other direction during a subsequent clock cycle. The noise filter 510 (i.e., in a majority filter implementation) waits until the output of the small difference phase detector 500 remains at a constant shift signal condition for a predetermined number of clock cycles. In one exemplary embodiment, the noise filter 510 may be an n-stage shift register that delivers the enable signal after n consecutive shift signals are asserted. An exemplary number of shift stages is 2.

The detection circuit 220 also includes a large difference phase detector 520 configured to detect a large phase difference between the CLKIN and FCLK signals. The large difference phase detector 520, having a larger activation threshold, allows large phase changes that may result from temperature or voltage deviations to bypass the noise filter 510 and quickly enable the control circuit 320, 430 of the synchronization circuit 210 to resynchronize the CLKIN and FCLK signals.

In one exemplary embodiment, the small difference phase detector 500 may be configured to detect phase differences corresponding to at least one delay stage in the main delay line 310, 440. The large difference phase detector 520 may be configured to detect phase differences corresponding to three or more delay stages. The noise filter 510 reduces jitter in the CLKOUT signal by verifying the persistence of small phase errors prior to enabling the synchronization circuit 210. The large difference phase detector 520 allows errors cause by significant deviations to be identified and acted upon without the requisite delay imparted by the noise filter 510.

Using the detection circuit 220 to selectively enable the synchronization circuit 210 to re-synchronize the output clock of the device 110 with respect to the external clock signal (CLKEX), as described above, has numerous advantages. First, a power savings is realized by disabling some of the circuitry in the synchronization circuit. Second, jitter in the output clock signal is reduced, because the synchronization circuit remains in a locked state until conditions exist that indicate the need to resynchronize. The noise filter 510 increases the noise tolerance of the timing control circuit 115 to small perturbations, yet the large difference phase detector 520 allows significant perturbations to be addressed quickly by bypassing the noise filter 510.

The particular embodiments disclosed above are illustrative only, as the invention may be modified and practiced in different but equivalent manners apparent to those skilled in the art having the benefit of the teachings herein. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

What is claimed:

1. A timing control circuit, comprising:

a synchronization circuit, comprising:

a main delay line configured to receive an input clock signal and delay the input clock signal by a time interval to generate an output clock signal;

a control circuit configured to control the main delay line to vary the time interval to synchronize the input clock signal with a feedback clock signal generated from the output clock signal, *control of the main delay line allowed* responsive to assertion of an enable signal; and a detection circuit configured to receive the input clock signal and the feedback clock signal, detect a phase alignment error between the input clock signal and the feedback clock signal, and assert the enable signal responsive to the phase alignment error exceeding a predetermined amount, said detection circuit comprising a noise filter for generating said enable signal.

2. The *timing control* circuit of claim 1, wherein the detection circuit includes a first phase detector configured to compare the input clock signal and the feedback clock signal and assert the enable signal responsive to the feedback clock signal being out of phase with respect to the input clock signal.

3. The *timing control* circuit of claim 1, wherein the detection circuit comprises:

a first phase detector having a first threshold and being configured to compare the input clock signal and the feedback clock signal and generate a shift signal responsive to the feedback clock signal being out of phase with respect to the input clock signal an amount greater than the first threshold; and the noise filter coupled to the first phase detector and being configured to filter the shift signal to generate the enable signal.

4. The *timing control* circuit of claim 3, wherein the noise filter is comprises an n-stage delay configured to assert the enable signal responsive to receiving n occurrences of the [first] shift signal.

5. The *timing control* circuit of claim 4, wherein n is at least two.

6. The *timing control* circuit of claim 3, wherein the detection circuit further comprises:

a second phase detector having a second threshold larger than the first threshold and being configured to compare the input clock signal and the feedback clock signal and assert the enable signal responsive to the feedback clock signal being out of phase with respect to the input clock signal an amount greater than the second threshold.

7. The *timing control* circuit of claim 1, further comprising a first delay model configured to receive the output clock signal and generate the feedback clock signal.

8. The *timing control* circuit of claim 1, wherein the synchronization circuit comprises a clock synchronized delay circuit.

9. The *timing control* circuit of claim 1, wherein the synchronization circuit comprises a synchronous mirror delay circuit.

10. The *timing control* circuit of claim 1, wherein the synchronization circuit *further* comprises:

a delay model configured to receive the input clock signal; and a measurement delay line having a plurality of stages and being coupled to the delay model wherein the control circuit is configured to detect a stage of the measurement delay line where the input clock signal as delayed by the delay model and the measurement delay line is in phase with the input clock signal.

11. The *timing control* circuit of claim 10, wherein the measurement delay line comprises a shift register and a plurality of control gates coupled to stages of the shift register.

12. The *timing control* circuit of claim 11, wherein the main delay line comprises a plurality of serially cascaded delay elements, each transfer gate of the transfer gate array is associated with *an associated* one of the serially cascaded delay elements, and [the] *an* active transfer gate is configured to transfer the input clock signal as delayed by the delay model and the measurement delay line to its associated one of the serially cascaded delay elements.

13. The *timing control* circuit of claim 10, wherein the control circuit comprises a latch array comprising a plurality of latches, each latch is coupled to *a respective* one of the stages of the measurement delay line, and one of the latches is active responsive to the input clock signal as delayed by the delay model and the measurement delay line being in phase with the input clock signal.

14. The *timing control* circuit of claim 13, wherein the main delay line comprises a plurality of serially cascaded delay elements, each latch of the control circuit is coupled to *an associated* one of the serially cascaded delay elements, and [the] *an* active latch in the latch array enables its associated one of the serially cascaded delay elements.

15. The *timing control* circuit of claim 10, wherein the control circuit comprises a transfer gate array comprising a plurality of transfer gates, each transfer gate is coupled to *a respective* one of the stages of the measurement delay line, and one of the transfer gates is active responsive to the input clock signal as delayed by the delay model and the measurement delay line being in phase with the input clock signal.

16. The *timing control* circuit of claim 1, wherein the control circuit is configured to lock a current state of the main delay line responsive to the enable signal being deasserted.

17. A timing control circuit, comprising:

a synchronization circuit, comprising:

a main delay line configured to receive an input clock signal and delay the input clock signal by a time interval to generate an output clock signal;

a first delay model configured to receive the output clock signal and generate a feedback clock signal;

a control circuit configured to control the main delay line to vary the tune interval to synchronize the input clock signal with the feedback clock signal responsive to assertion of an enable signal; and a detection circuit, comprising:

a first phase detector having a first threshold and being configured to compare the input clock signal and the feedback clock signal and generate a shift signal responsive to the feedback clock signal being out of phase with respect to the input clock signal an amount greater than the first threshold; and a noise filter coupled to the first phase detector and being configured to filter the shift signal to generate the enable signal.

18. The *timing control* circuit of claim 17, wherein the noise filter [is] comprises an n-stage delay configured to assert the enable signal responsive to receiving n occurrences of the [first] shift signal.

19. The *timing control* circuit of claim 18, wherein n is at least two.

[20. The circuit of claim 17, wherein the detection circuit further comprises:

a second phase detector having a second threshold larger than the first threshold and being configured to compare the input clock signal and the feedback clock signal and assert the enable signal responsive to the feedback clock signal being out of phase with respect to the input clock signal an amount greater than the second thresh old.]

21. The *timing control* circuit of claim 17, wherein the synchronization circuit comprises a clock synchronized delay circuit.

22. The *timing control* circuit of claim 17, wherein the synchronization circuit comprises a synchronous mirror delay circuit.

23. The *timing control* circuit of claim 17, wherein the control circuit is configured to lock a current state of the main delay line responsive to the enable signal being deasserted.

24. A digital system, comprising:

a first digital device configured to provide an external clock signal; [and]

a second digital device configured to receive the external clock signal, the second digital device including: an input buffer configured to receive the external clock signal and generate an input clock signal based thereon; *and* a synchronization circuit, comprising:

a main delay line coupled to the input buffer and configured to delay the input clock signal by a time interval to generate an output clock signal;

a control circuit configured to control the main delay line to vary the time interval to synchronize the input clock signal with a feedback clock signal generated from the output clock signal, *a state of the control circuit locked* responsive to [assertion of] an enable signal; and a detection circuit configured to receive the input clock signal and the feedback clock signal, detect a phase alignment error between the input clock signal and the feedback clock signal, and assert the enable signal responsive to the phase alignment error exceeding a predetermined amount, said detection circuit comprising a noise filter for generating said enable signal.

25. The system of claim 24, wherein the detection circuit includes a first phase detector configured to compare the input clock signal and the feedback clock signal and assert the enable signal responsive to the feedback clock signal being out of phase with respect to the input clock signal.

26. The system of claim 24, wherein the detection circuit comprises:

a first phase detector having a first threshold and being configured to compare the input clock signal and the feedback clock signal and generate a shift signal responsive to the feedback clock signal being out of phase with respect to the input clock signal an amount greater than the first threshold; and the noise filter coupled to the first phase detector and being configured to filter the shift signal to generate the enable signal.

27. The system of claim 26, wherein the noise filter is comprises an n-stage delay configured to assert the enable signal responsive to receiving n occurrences of the [first] shift signal.

28. The system of claim 27, wherein n is at least two.

29. The system of claim 26, wherein the detection circuit further comprises:

a second phase detector having a second threshold larger than the first threshold and being configured to compare the input clock signal and the feedback clock signal and assert the enable signal responsive to the feedback clock signal being out of phase with respect to the input clock signal an amount greater than the second threshold.

30. The system of claim 24, further comprising a first delay model configured to receive the output clock signal and generate the feedback clock signal.

31. The system of claim 24, wherein the synchronization circuit comprises a clock synchronized delay circuit.

32. The system of claim 24, wherein the synchronization circuit comprises a synchronous mirror delay circuit.

33. The system of claim 24, wherein the synchronization circuit *further* comprises*:* a delay model configured to receive the input clock signal; and a measurement delay line having a plurality of stages and being coupled to the delay model, wherein the control circuit is configured to detect a stage of the measurement delay line where the input clock signal as delayed by the delay model and the measurement delay line is in phase with the input clock signal.

34. The system of claim 33, wherein the measurement delay line comprises a shift register and a plurality of control gates coupled to stages of the shift register.

35. The system of claim 34, wherein the main delay line comprises a plurality of serially cascaded delay elements, each transfer gate of the transfer gate array is associated with *an associated* one of the serially cascaded delay elements, and [the] *an* active transfer gate is configured to transfer the input clock signal as delayed by the delay model and the measurement delay line to its associated one of the serially cascaded delay elements.

36. The system of claim 34, wherein the control circuit is configured to lock a current state of the main delay line responsive to the enable signal being deasserted.

37. The system of claim 33, wherein the control circuit comprises a latch array comprising a plurality of latches, each latch is coupled to *a respective* one of the stages of the measurement delay line, and one of the latches is active responsive to the input clock signal as delayed by the delay model and the measurement delay line being in phase with the input clock signal.

38. The system of claim 37, wherein the main delay line comprises a plurality of serially cascaded delay elements, each latch of the control circuit is coupled to *an associated* one of the serially cascaded delay elements, and [the] *an* active latch in the latch array enables its associated one of the serially cascaded delay elements.

39. The system of claim 33, wherein the control circuit comprises a transfer gate array comprising a plurality of transfer gates, each transfer gate is coupled to *a respective* one of the stages of the measurment delay line, and one of the transfer gates is active responsive to the input clock signal as delayed by the delay model and the measurement delay line being in phase with the input clock signal.

40. A method for synchronizing clock signals, comprising:

receiving an input clock signal;

delaying the input *clock* signal by a time interval to generate an output clock signal;

controlling the time interval to synchronize the input clock signal with a feedback clock signal generated from the output clock signal responsive to assertion of an enable signal;

detecting a phase alignment error between the input clock signal and the feedback clock signal;

and asserting the enable signal responsive to the phase alignment error exceeding a predetermined amount, asserting said enable signal comprising using a noise filter to generate said enable signal.

41. The method of claim 40, further comprising:

comparing the input clock signal and the feedback clock signal; and asserting the enable signal responsive to the feedback clock signal being out of phase with respect to the input clock signal.

42. The method of claim 40, further comprising:

comparing the input clock signal and the feedback clock signal;

generating a shift signal responsive to the feedback clock signal being out of phase with respect to the input clock signal an amount greater than a first threshold; and filtering the shift signal to generate the enable signal.

43. The method of claim 42, wherein filtering the shift signal further comprises asserting the enable signal responsive to receiving n occurrences of [the] *a* first shift signal.

44. The method of claim 43, wherein filtering the shift signal further comprises asserting the enable signal responsive to receiving at least two occurrences of the first shift signal.

45. The method of claim 42, further comprising asserting the enable signal responsive to the feedback clock signal being out of phase with respect to the input clock signal an amount greater than a second threshold.

46. The method of claim 40, further comprising delaying the output clock signal to generate the feedback clock[.] signal.

47. The method of claim 40, wherein delaying the input *clock* signal further comprises delaying the input *clock* signal in a delay line, and the method further comprises locking a current state of the delay line responsive to the enable signal being deasserted.

48. A method for synchronizing clock signals, comprising:

receiving an input clock signal;

delaying the input *clock* signal by a time interval to generate an output clock signal;

controlling the time interval to synchronize the input clock signal with a feedback clock generated from the output clock signal responsive to assertion of an enable signal;

detecting a phase alignment error between the input clock signal and the feedback clock signal;

generating a first shift signal responsive to the phase alignment error exceeding a first predetermined amount;

filtering the first shift signal to generate a filtered shift signal;

generating a second shift signal responsive to the phase alignment error exceeding a second predetermined amount; and asserting the enable signal based on either of the filtered shift signal and the second shift signal being asserted.

49. A device, comprising:

means for receiving an input clock signal;

means for delaying the input *clock* signal by a time interval to generate an output clock signal;

means for controlling the time interval to synchronize the input clock signal with a feedback clock signal generated from the output clock signal responsive to assertion of an enable signal;

means for detecting a phase alignment error between the input clock signal and the feedback clock signal; and means for asserting the enable signal responsive to the phase alignment error exceeding a predetermined amount, said means for asserting said enable signal comprising means for using a noise filter to generate said enable signal.

50. A device, comprising:

means for receiving an input clock signal;

means for delaying the input *clock* signal by a time interval to generate an output clock signal;

means for controlling the time interval to synchronize the input clock signal with a feedback clock signal generated from the output clock signal responsive to assertion of an enable signal;

means for detecting a phase alignment error between the input clock signal and the feedback clock signal;

means for generating a first shift signal responsive to the phase alignment error exceeding a first predetermined amount;

means for filtering the first shift signal to generate a filtered shift signal;

means for generating a second shift signal responsive to the phase alignment error exceeding a second predetermined amount; and means for asserting the enable signal based on either of this filtered shift signal and the second shift signal being asserted.

51. A timing control circuit, comprising:

a synchronization circuit to delay an input clock signal and generate a feedback clock signal that is substantially synchronized with the input clock signal, said synchronization circuit comprising a main delay line configured to delay said input signal and a control circuit configured to control the main delay line to synchronize the input clock signal with [a] *the* feedback clock signal; and a detection circuit communicatively coupled to the synchronization circuit to monitor a degree of synchronization between the input clock signal and the feedback *clock* signal over time to selectively enable resynchronization of the input clock signal and the feedback signal based on the degree of synchronization, said detection circuit comprising a noise filter for generating an enable signal for enabling said resynchronization.

52. The circuit of claim 51, wherein the degree of synchronization is based on a phase alignment error between the input clock signal and the feedback clock signal.

53. The circuit of claim 52, wherein the detection circuit asserts [an] *the* enable signal to the synchronization circuit responsive to the phase alignment error exceeding a predetermined amount.

54. The circuit of claim 51, wherein the detection circuit comprises:

a first phase detector having a first threshold and being configured to compare the input clock signal and the feedback clock signal and generate a shift signal responsive to the feedback clock signal being out of phase with respect to the input clock signal an amount greater than the first threshold; and the noise filter comprises a majority filter coupled to the first phase detector and being configured to filter the shift signal to generate the enable signal.

55. The circuit of claim 54, wherein the detection circuit further comprises:

a second phase detector having a second threshold larger than the first threshold and being configured to compare the input clock signal and the feedback clock signal and assert the enable signal responsive to the feedback clock signal being out of phase with respect to the input clock signal an amount greater than the second threshold.

56. A timing control circuit, comprising:

a synchronization circuit to delay an input clock signal and generate a feedback clock signal that is substantially synchronized with the input clock signal, said synchronization circuit comprising a main delay line configured to delay said input *clock* signal and a control circuit configured to control the main delay line to synchronize the input clock signal with [a] *the* feedback clock signal *and further configured to have a locked state responsive to an enable signal*; and a detection circuit to receive the input clock signal and the feedback clock signal, determine difference between the input clock signal and the feedback clock signal and provide [an] *the* enable signal to the synchronization circuit responsive to the determined difference *to allow the state of the control circuit to be changed*, said detection circuit comprising a noise filter for generating said enable signal.

57. The circuit of claim 56, wherein the difference between the input clock signal and the feedback clock signal is based on a phase alignment error between the input clock signal and the feedback clock signal.

58. The circuit of claim 57, wherein the detection circuit asserts the enable signal responsive to the phase alignment error exceeding a predetermined amount.

59. The circuit of claim 56, wherein the detection circuit comprises:

a first phase detector having a first threshold and being configured to compare the input clock signal and the feedback clock signal and generate a shift signal responsive to the feedback clock signal being out of phase with respect to the input clock signal an amount greater than the first threshold; and the noise filter coupled to the first phase detector and being configured to filter the shift signal to generate the enable signal.

60. The circuit of claim 59, wherein the detection circuit further comprises:

a second phase detector having a second threshold larger than the first threshold and being configured to compare the input clock signal and the feedback clock signal and assert the enable signal responsive to the feedback clock signal being out of phase with respect to the input clock signal an amount greater than the second threshold.

*61. An apparatus, comprising:*

*a delay line configured to delay an input clock signal by a time interval to generate an output clock signal;*

*a control circuit coupled to the delay line and configured to control the time interval to synchronize the input clock signal with a feedback clock generated from the output clock signal responsive to assertion of an enable signal;*

*a detection circuit coupled to the control circuit and configured to detect a phase alignment error between the input clock signal and the feedback clock signal and generate a first shift signal responsive to the phase alignment error exceeding a first predetermined amount, the*

*detection circuit further configured to filter the first shift signal to generate a filtered shift signal, the detection circuit further configured to generate a second shift signal responsive to the phase alignment error exceeding a second predetermined amount and assert the enable signal based on either of the filtered shift signal and the second shift signal being asserted.*

*62. The apparatus of claim 61 wherein the detection circuit comprises:*

*a first phase detector configured to compare the input clock signal and the feedback clock signal and provide the first shift signal responsive to the phase alignment error exceeding the first predetermined amount; and*

*a second phase detector configured to compare the input clock signal and the feedback clock signal and provide the second shift signal responsive to the phase alignment error exceeding the second predetermined amount.*

*63. The apparatus of claim 62 wherein the first predetermined amount is different than the second predetermined amount.*

* * * * *